(12) United States Patent
Nishimura et al.

(10) Patent No.: US 8,114,781 B2
(45) Date of Patent: Feb. 14, 2012

(54) SUBSTRATE PROCESSING METHOD AND SUBSTRATE PROCESSING APPARATUS

(75) Inventors: Eiichi Nishimura, Nirasaki (JP); Koichi Yatsuda, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 879 days.

(21) Appl. No.: 11/769,147

(22) Filed: Jun. 27, 2007

(65) Prior Publication Data
US 2008/0003836 A1 Jan. 3, 2008

Related U.S. Application Data

(60) Provisional application No. 60/832,133, filed on Jul. 21, 2006.

(30) Foreign Application Priority Data

Jun. 29, 2006 (JP) ................................. 2006-180184

(51) Int. Cl.
*H01L 21/302* (2006.01)

(52) U.S. Cl. ........ 438/710; 438/723; 438/724; 438/743; 438/744

(58) Field of Classification Search .................. 438/710, 438/723, 724, 743, 744
See application file for complete search history.

(56) References Cited

U.S. PATENT DOCUMENTS

| 6,534,351 B2 * | 3/2003 | Muller et al. ................. 438/182 |
| 2004/0043638 A1 * | 3/2004 | Nansei et al. ................. 438/792 |
| 2005/0181607 A1 * | 8/2005 | Aoyama ....................... 438/675 |
| 2006/0042752 A1 * | 3/2006 | Rueger ....................... 156/345.1 |
| 2006/0057828 A1 * | 3/2006 | Omura et al. ................. 438/595 |

FOREIGN PATENT DOCUMENTS

| JP | S57-138139 | 8/1982 |
| JP | 6-181188 | 6/1994 |
| JP | H09-171996 | 6/1997 |
| JP | 2003-264183 | 9/2003 |

OTHER PUBLICATIONS

Waseda et al., IEE Transactions on Instrumentation and Measurement, vol. 56, No. 2, "Density Evaluation of Thermal-Oxide Layers on Silicon Crystals by the Pressure-Of-Flotation Method" via http://ieeexplore.ieee.org/stamp/stamp.jsp?arnumber=04126924; pp. 628-631; 2007.*

Wikipedia, the Free Encyclopedia; "Silicon monoxide" via http://en.wikipedia.org/wiki/Silicon_monoxide ; 3 pages, 2010.*

Japanese Office Action issued in Japanese Patent Application No. 2006-180184 mailed Nov. 8, 2011 (with English translation).

* cited by examiner

*Primary Examiner* — Binh X Tran
(74) *Attorney, Agent, or Firm* — Oblon, Spivak, McClelland, Maier & Neustadt, L.L.P.

(57) ABSTRACT

A substrate processing method capable of selectively removing a nitride film. Oxygen plasma containing plasmarized oxygen gas is made to be in contact with a silicon nitride film, which is made of SiN, of a wafer to thereby cause the silicon nitride film to be changed to a silicon monoxide film. The silicon monoxide film is selectively etched by hydrofluoric acid generated from HF gas supplied toward the silicon monoxide film.

9 Claims, 4 Drawing Sheets

SUBSTRATE PROCESSING METHOD AND SUBSTRATE PROCESSING APPARATUS

BACKGROUND OF THE INVENTION

1. Field of the Invention

The present invention relates to a substrate processing method and a substrate processing apparatus, and more particular, to a substrate processing method for processing a substrate formed with a thermally-oxidized film and a silicon nitride film.

2. Description of the Related Art

A semiconductor device wafer (substrate) has been known that has a thermally-oxidized film, such as an oxide silicon film, formed by thermal oxidation processing and a silicon nitride film formed by CVD processing or the like. The silicon nitride film is used as an antireflection (BARC) film or a spacer for separating a gate from a source/drain. The thermally-oxidized film constitutes a gate oxide film.

A method of etching a silicon nitride film has been known (see Japanese Laid-open Patent Publication No. 2003-264183), in which a compound gas that contains fluorine as a constituent element and does not contain carbon as a constituent element, such as for example a compound gas containing HF gas, is converted into a plasma, and the plasmarized compound gas is reacted with carbon to produce chemical species (radicals) by which a silicon nitride film is etched.

However, even the thermally-oxidized film is etched by the chemical species. For example, in the case of a wafer having a silicon substrate on which an oxide silicon film (thermally-oxidized film) is formed as a gate insulation film and a silicon nitride film as an antireflection film is further formed on the oxide silicon film, not only the silicon nitride film but also the oxide silicon film is etched by the above described etching method. Since the gate insulation film is usually formed to be thinner than the antireflection film, the oxide silicon film is removed prior to removal of the silicon nitride film. As a result, even the silicon substrate is impaired (etched).

SUMMARY OF THE INVENTION

The present invention provides a substrate processing method and a substrate processing apparatus that are capable of selectively removing a nitride film.

According to a first aspect of the present invention, there is provided a substrate processing method for processing a substrate having a thermally-oxidized film formed by thermal oxidation processing and a nitride film, comprising an oxygen-containing plasma contact step of causing oxygen-containing plasma to be in contact with the substrate, and an HF gas supply step of supplying HF gas toward the substrate with which the oxygen-containing plasma has been in contact.

According to this substrate processing method, oxygen-containing plasma is made in contact with a substrate having a thermally-oxidized film formed by thermal oxidation processing and a nitride film, and then HF gas is supplied to the substrate. The oxygen-containing plasma changes the nitride film into an oxide film, and the oxide film changed from the nitride film is selectively etched by hydrofluoric acid produced from the HF gas. As a result, the nitride film can selectively be removed.

In the above described substrate processing method, the substrate can have a protruding conductive portion protruding from the thermally-oxidized film, and the nitride film can cover or coat side surfaces and a top surface of the conductive portion. In the oxygen-containing plasma contact step, active species in the oxygen-containing plasma can move substantially parallel to the side surfaces of the conductive portion and can be in contact with the nitride film.

In this case, the active species in the oxygen-containing plasma move in the direction nearly parallel to the side surfaces of the conductive portion toward the nitride film covering the side surfaces and the top surface of the conductive portion, so that the active species are made in contact with the nitride film, thereby causing the nitride film to be changed to an oxide film. Since parts of the nitride film covering the side surfaces of the conductive portion are large in thickness as viewed in the direction in which the active species move, the active species cannot sufficiently intrude into the nitride film parts that cover the side surfaces of the conductive portion. As a result, the nitride film that has not been changed to the oxide film remains on the side surfaces of the conductive portion. Although the hydrofluoric acid produced from the HF gas selectively etches the oxide film changed from the nitride film, but does not etch the nitride film remaining on the side surfaces of the conductive portion. As a result, the part of the nitride film covering the conductive portion is not removed, but the other part thereof can selectively be removed.

In the substrate processing method, the active species can include at least cations.

In that case, the active species include at least cations. Upon generation of plasma, a sheath is generated in a space near a surface of the substrate and accelerates the cations toward the surface of the substrate. As a result, it can be ensured that the cations are made to be in contact with the nitride film on the substrate.

The substrate processing method can include a selective oxidation step of selectively oxidizing a flat portion of the nitride film.

In that case, a flat portion of the nitride film is selectively oxidized. Hydrofluoric acid generated from the HF gas selectively etches the oxide film changed from the nitride film. Thus, the flat portion of the nitride film can selectively be etched.

In the substrate processing method, the substrate can comprise a protruding conductive portion on the thermally-oxidized film, the protruding conductive portion perpendicularly protruding from a surface of the substrate, and the nitride film can cover side surfaces and a top surface of the conductive portion. In the oxygen-containing plasma contact step, active species in the oxygen-containing plasma can move in a direction approximately perpendicular to the surface of the substrate, whereby the active species can be in contact with the nitride film.

In that case, the active species in the oxygen-containing plasma move in the direction approximately perpendicular to the surface of the substrate toward the nitride film that covers the side surfaces and the top surface of the protruding conductive portion protruding perpendicular to the surface of the substrate. The active species are made in contact with the nitride film and convert the nitride film into an oxide film. Since the parts of the nitride film which cover the side surfaces of the conductive portion are large in thickness as viewed in the direction perpendicular to the surface of the substrate, the active species moving in the direction nearly perpendicular to the surface of the substrate cannot adequately intrude into the nitride film part that covers the side surfaces of the conductive portion. As a result, on the side surfaces of the conductive portion, there remains the nitride film that has not been changed to the oxide film. The hydrofluoric acid generated from the HF gas selectively etches the oxide film changed from the nitride film but does not etch the nitride film remaining on the side surface of the conductive portion. As a result, except for the nitride film parts that cover the side surfaces of the conductive portion, the nitride film can selectively be removed.

The substrate processing method can include a selective oxidation step of selectively oxidizing a flat portion of the nitride film.

In that case, the flat portion of the nitride film is selectively oxidized. The hydrofluoric acid generated from the HF gas selectively etches the oxide film that has been changed from the nitride film. As a result, it is possible to selectively remove the flat portion of the nitride film.

According to a second aspect of the present invention, there is provided a substrate processing apparatus for processing a substrate having a thermally-oxidized film formed by thermal oxidation processing and a nitride film, the substrate processing apparatus comprising an oxygen-plasma contact unit adapted to cause oxygen-containing plasma to be in contact with the substrate, and an HF gas supply unit adapted to supply HF gas toward the substrate with which the oxygen-containing plasma has been in contact.

With the substrate processing apparatus according to the second aspect of the present invention, effects which are the same as or similar to those achieved by the first aspect of the present invention can be achieved.

Further features of the present invention will become apparent from the following description of exemplary embodiments with reference to the attached drawings.

BRIEF DESCRIPTION OF THE DRAWINGS

FIGS. 2A and 2B are sectional views showing a second process module in FIG. 1, wherein FIG. 2A is a sectional view taken along line I-I in FIG. 1, and FIG. 2B is a fragmentary enlarged view showing a portion A in FIG. 2A;

FIGS. 3A to 3E are views showing a process of the substrate processing method according to the first embodiment of this invention, wherein FIG. 3A is a fragmentary sectional view of a wafer, FIG. 3B is a fragmentary sectional view showing a step of causing cations to be in contact with a silicon nitride film on the wafer, FIG. 3C is a fragmentary sectional view showing a wafer containing a silicon monoxide film changed from the silicon nitride film with which the cations have been made in contact, FIG. 3D is a fragmentary sectional view showing a step of supplying HF gas toward the wafer, and FIG. 3E is a fragmentary sectional view of the wafer from which the silicon monoxide film has been removed; and FIGS. 4A to 4E are views showing a process of a substrate processing method according to a second embodiment of the present invention, wherein FIG. 4A is a fragmentary sectional view of a wafer having a thermally-oxidized film and a gate electrode thereof covered by a silicon nitride film, FIG. 4B is a fragmentary sectional view showing a step of causing cations to be in contact with the silicon nitride film of the wafer, FIG. 4C is a fragmentary sectional view showing the wafer that has nitride portions thereof remaining on a side surface of the gate electrode after the cations are made in contact with the nitride film, FIG. 4D is a fragmentary sectional view showing a step of supplying HF gas to the wafer, and FIG. 4E is a fragmentary sectional view of the wafer having the nitride portions thereof formed on the side surfaces of the gate electrode.

DETAILED DESCRIPTION OF THE PREFERRED EMBODIMENTS

The present invention will now be described in detail below with reference to the drawings showing preferred embodiments thereof.

First, an explanation will be given of a substrate processing system for carrying out a substrate processing method according to a first embodiment of the present invention.

Figure 1:
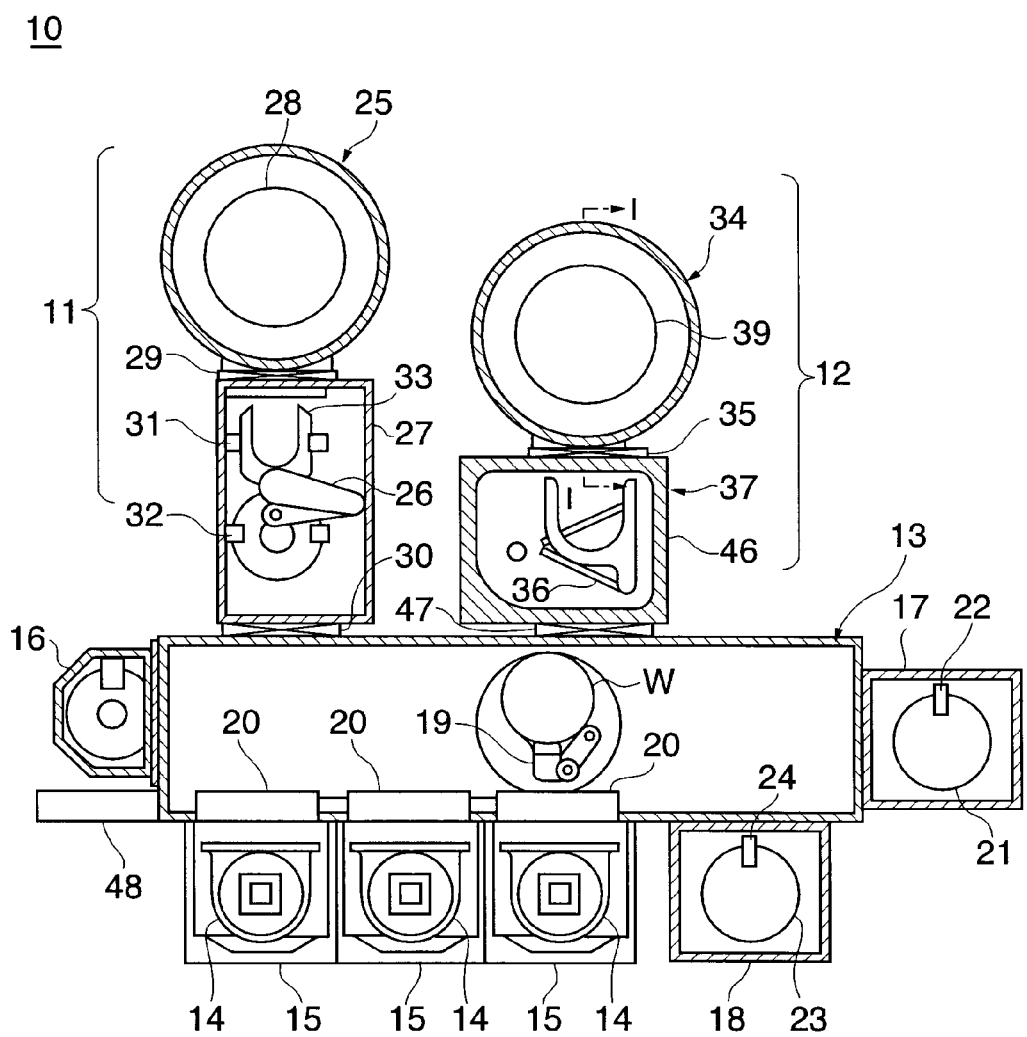
FIG. 1 is a plan view schematically showing the construction of a substrate processing system for carrying out a substrate processing method according to a first embodiment of this invention.

FIG. 1 is a plan view schematically showing the construction of the substrate processing system of this embodiment.

As shown in FIG. 1, the substrate processing system (substrate processing apparatus) 10 has a first process ship 11 for carrying out plasma processing on semiconductor device wafers W (substrates), hereinafter referred to simply as "wafers", a second process ship 12 that is disposed parallel to the first process ship 11 and is for carrying out selective etching, described below, on the wafers W on which the plasma processing has been effected in the first process ship 11, and a loader unit 13 which is a rectangular common transfer chamber and to which the first and second process ships 11, 12 are connected.

In addition to the first and second process ships 11 and 12, there are connected to the loader unit 13 three FOUP mounting stages 15 each mounted with a FOUP (front opening unified pod) 14, which is a container adapted to house twenty-five wafers W, an orienter 16 used for pre-alignment of a wafer W transferred out from a FOUP 14, and first and second IMS's (Integrated Metrology Systems manufactured by Therma-Wave, Inc.) 17, 18 for measuring the surface state of the wafer W.

The first and second process ships 11, 12 are connected to a longitudinal side wall of the loader unit 13 and disposed to face the three FOUP mounting stages 15 with the loader unit 13 therebetween. The orienter 16 is disposed at a longitudinal one end of the loader unit 13, the first IMS 17 is disposed at another longitudinal end of the loader unit 13, and the second IMS 18 is disposed alongside the three FOUP mounting stages 15.

The loader unit 13 includes a SCARA-type dual arm transfer arm mechanism 19 disposed inside the unit 13 and adapted to transfer wafers W, and three loading ports 20 formed in a side wall of the unit 13 to correspond to the FOUP mounting stages 15. The transfer arm mechanism 19 takes a wafer W out from the corresponding FOUP 14 on the FOUP mounting stage 15 through the loading port 20, and transfers the removed wafer W into and out of the first process ship 11, the second process ship 12, the orienter 16, the first IMS 17, and the second IMS 18.

The first IMS 17 is an optical monitor that has a mounting stage 21 adapted to be mounted with a wafer W transferred into the first IMS 17, and an optical sensor 22 adapted to be directed to the wafer W mounted on the mounting stage 21. The first IMS 17 measures the surface shape of the wafer W, for example the film thickness of polysilicon film, and CD (critical dimension) values of wiring grooves, gate electrodes and so on. Like the first IMS 17, the second IMS 18 is an optical monitor and has a mounting stage 23 and an optical sensor 24.

The first process ship 11 has a first process module 25 (oxygen-containing plasma contact unit) in which plasma processing is carried out on the wafer W, and a first load lock module 27 containing a link-type single pick first transfer arm 26 for transferring the wafer W into and out of the first process module 25.

The first process module 25 has a cylindrical processing chamber and upper and lower electrodes (none of which is shown) disposed in the chamber, the distance between the upper and lower electrodes being set to an appropriate value for carrying out the plasma processing on the wafer W. Moreover, the lower electrode has in a top portion thereof an ESC (electrostatic chuck) 28 for chucking the wafer W thereto using a Coulomb force or the like.

In the first process module 25, oxygen gas is introduced into the chamber and an electric field is generated between the upper and lower electrodes, whereby the introduced oxygen gas is turned into plasma so as to produce oxygen plasma. Active species contained in the oxygen plasma, specifically cations, are made in contact with the wafer W for plasma processing of the wafer.

In the first process ship 11, the internal pressure of the first process module 25 is held at vacuum, whereas the internal pressure of the loader unit 13 is held at atmospheric pressure. To this end, the first load lock module 27 is provided with a vacuum gate valve 29 in a connecting part between itself and the first process module 25, and an atmospheric gate valve 30 in a connecting part between itself and the loader unit 13, whereby the first load lock unit 27 is constructed as a preliminary vacuum transfer chamber whose internal pressure can be adjusted.

Within the first load lock module 27, the first transfer arm 26 is disposed in a central portion of the module 27, and first and second buffers 31, 32 are disposed toward the first process module 25 and toward the loader module 31, respectively, with respect to the first transfer arm 26. The first and second buffers 31, 32 are disposed on a track along which a supporting portion (pick) 33 moves, the supporting portion 33 being adapted to support the wafer W which is at a distal end of the first transfer arm 26. After having being subjected to the plasma processing, the wafer W is temporarily retreated above the track of the supporting portion 33, whereby the wafer W having been subjected to the plasma processing can be smoothly changed over in the first process module 25 to a wafer W to be subjected to the plasma processing.

The second process ship 12 has a second process module 34 in which selective etching, described later, is carried out on the wafer W, and a second load lock module 37 connected to the second process module 34 via a vacuum gate valve 35 and containing a link-type single pick second transfer arm 36 for transferring the wafer W into and out of the second process module 34.

Figure 2A:
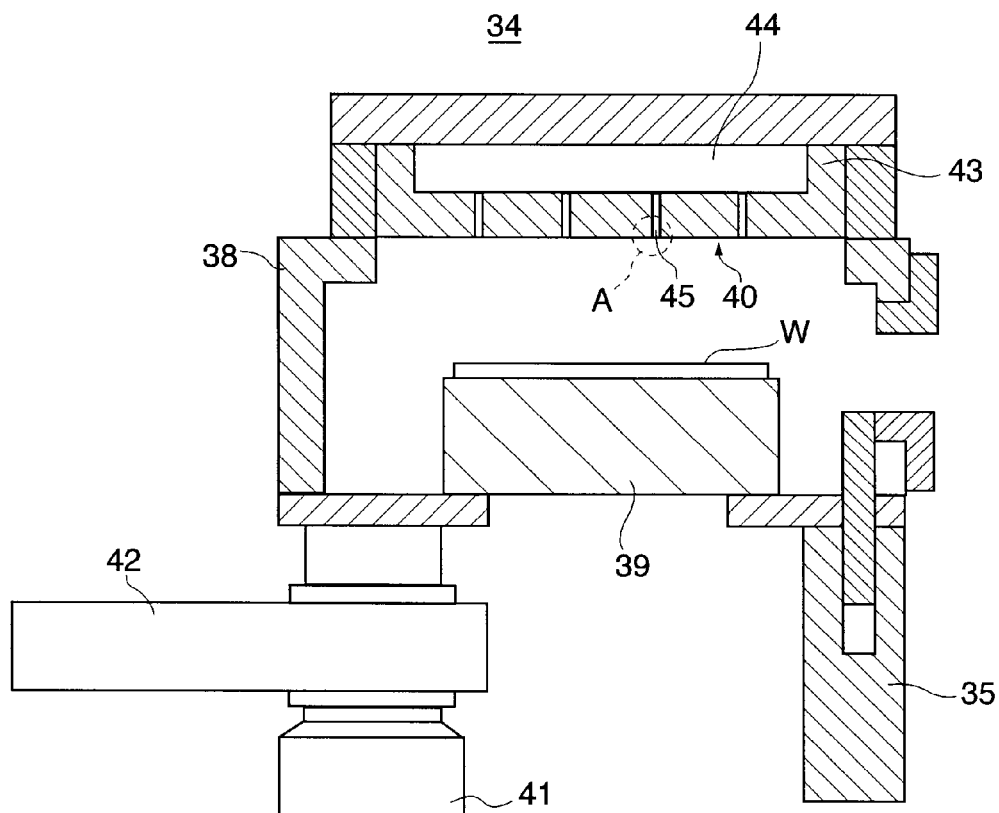
Figure 2B:
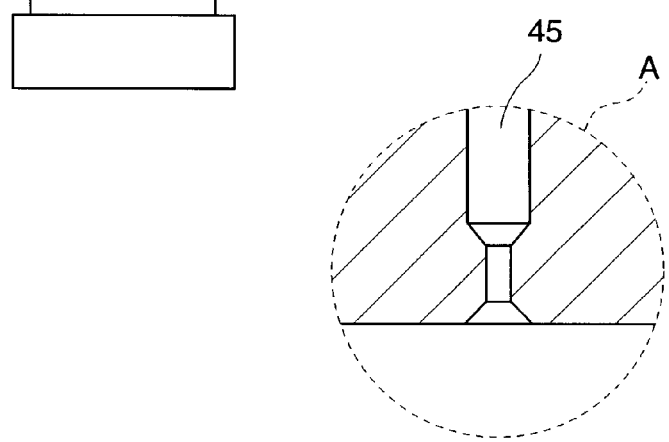

FIGS. 2A and 2B are sectional views of the second process module in FIG. 1. FIG. 2A is a sectional view taken along line I-I in FIG. 1, and FIG. 2B is an enlarged view of a portion A shown in FIG. 2A.

As shown in FIG. 2A, the second processing unit 34 has a cylindrical processing chamber 38, a wafer mounting stage 39 disposed in the chamber 38, a shower head 40 disposed above the chamber 38 so as to face the mounting stage 39, a TMP (turbo molecular pump) 41 for exhausting gas out from the chamber 38, and an APC (adaptive pressure control) valve 42 that is a variable butterfly valve disposed between the chamber 38 and the TMP 41 for controlling the pressure in the chamber 38.

The shower head 40 has a gas supply unit 43 (HF gas supply unit) having a buffer chamber 44 communicated with the interior of the chamber 38 via gas-passing holes 45.

The buffer chamber 44 in the gas supply unit 43 of the shower head 40 is connected to an HF gas supply system (not shown) from which an HF gas is supplied to the buffer chamber 44. The supplied HF gas is then supplied to the chamber 38 via the gas-passing holes 45. The gas supply unit 43 of the shower head 40 has a heater, for example a heating element (not shown) built therein. The heating element is for controlling the temperature of the HF gas in the buffer chamber 44.

As shown in FIG. 2B, each gas-passing hole 45 in the shower head 40 has a portion thereof opening into the chamber 38 and formed so as to widen out toward an end of the gas-passing hole. As a result, the HF gas can be made to diffuse through the chamber 38 efficiently. Furthermore, the gas-passing holes 45 each have a constriction therein as viewed in cross section, and therefore, any deposit produced in the chamber 38 can be prevented from flowing back into the gas-passing holes 45 and the buffer chamber 44.

In the second process module 34, a heater (not shown), for example a heating element, is built into a side wall of the chamber 38, whereby the temperature of the atmosphere in the chamber 38 can be prevented from decreasing to below normal temperatures. As a result, removal of a silicon monoxide film 54, described later, by hydrofluoric acid can be promoted. Moreover, the heating element in the side wall heats the side wall, whereby by-products produced during the removal of the silicon monoxide film 54 by hydrofluoric acid can be prevented from becoming attached to the inside of the side wall.

The mounting stage 39 has a coolant chamber (not shown) therein as a temperature adjusting mechanism. A coolant, for example cooling water or a Galden fluid, at a predetermined temperature is supplied to the coolant chamber, so that the temperature of the wafer W held on an upper surface of the mounting stage 39 is controlled through the temperature of the coolant.

Referring to FIG. 1 again, the second load lock module 37 is provided with a housing-like transfer chamber 46 in which the second transfer arm 36 is disposed. The internal pressure in the second process module 34 is held at below atmospheric pressure, e.g., vacuum, whereas the internal pressure of the loader unit 13 is held at atmospheric pressure. To this end, the second load lock module 37 is provided with a vacuum gate valve 35 in a connecting part between itself and the second process module 34, and an atmospheric gate valve 47 in a connecting part between itself and the loader unit 13, whereby the second load lock unit 37 is constructed as a preliminary vacuum transfer chamber whose internal pressure can be adjusted.

The substrate processing system 10 is provided with an operation panel 48 disposed at a longitudinal one end of the loader unit 13. The operation panel 48 has a display section comprised of, for example, an LCD (liquid crystal display), for displaying the state of operation of component elements of the substrate processing system 10.

As a method for selectively etching an impurity-containing oxide film formed on a wafer having a thermally-oxidized film formed thereon by thermal oxidation processing as well as the impurity-containing oxide film formed thereon by CVD processing, there has been known a method in which HF gas or a mixture gas of HF gas and $H_2O$ gas is used without being converted into plasma (see, Japanese Laid-open Patent Publication No. 06-181188, for example).

In order to much enhance the selectivity of the impurity-containing oxide film relative to the thermally-oxidized film than in the just-mentioned method, the present inventors have performed experiments and, as a result, found that the selectivity of an impurity-containing oxide film relative to a thermally-oxidized film of a wafer W could remarkably be enhanced by supplying only HF gas to the wafer W, without supplying $H_2O$ gas in an environment in which substantially no $H_2O$ is present.

The present inventors further conducted extensive research on the mechanism for realizing high sensitivity, and reached a tentative theory, which will be described below.

When HF gas is combined with $H_2O$, hydrofluoric acid is formed which erodes and removes an oxide film. In order to form hydrofluoric acid from HF gas in an environment where there is substantially no $H_2O$, HF gas is required to be combined with water ($H_2O$) molecules contained in the oxide film.

An impurity-containing oxide film, which is formed by vapor deposition such as CVD processing, is nondense in film structure and hence likely to be attached with water molecules. Namely, such an impurity-containing oxide film contains some water molecules. When HF gas reaches the impurity-containing oxide film, the HF gas is combined with water molecules to form hydrofluoric acid, which erodes the impurity-containing oxide film.

On the other hand, the thermally-oxidized film is formed by thermal oxidation processing in an environment where the temperature varies from 800 to 900 Celsius degrees. Thus, no water molecules are included in the thermally-oxidized film during the fabrication of the film. Besides, the thermally-oxidized film is dense in film structure. Therefore, water molecules are less easily to be attached to the thermally-oxidized film. As a result, the thermally-oxidized film contains substantially no water molecules. Since water molecules are not present, even if the supplied HF gas reaches the thermally-oxidized film, the HF gas does not form hydrofluoric acid. Thus, the thermally-oxidized film cannot be eroded.

As described above, the sensitivity of an impurity-containing oxide film relative to a thermally-oxidized film can largely be increased by supplying only HF gas to a wafer, without $H_2O$ gas being supplied, in an environment where substantially no $H_2O$ is present (selective etching).

Figure 3A:
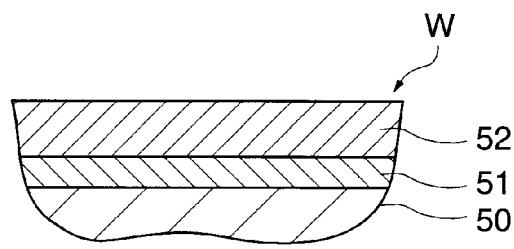

In this embodiment, the above described selective etching using hydrofluoric acid is utilized to selectively remove a silicon nitride film 52 from a wafer W having a silicon substrate 50 as shown in FIG. 3A on which a thermally-oxidized film 51 made of $SiO_2$ and formed by thermal oxidation processing and the silicon nitride film 52 (nitride film) made of SiN and formed by CVD processing are stacked in layers. Specifically, the silicon nitride film 52 on the wafer W is first converted into an oxide film by oxidation processing, and then the above described selective etching using hydrofluoric acid is performed.

In the following, an explanation will be given of oxidation processing on the silicon nitride film 52 in this embodiment.

When active species 53, for example cations, contained in oxygen plasma ($O_2$ plasma) generated from oxygen ($O_2$) gas are made in contact with the silicon nitride film 52 (FIG. 3B), chemical reaction takes place between SiN in the silicon nitride film 52 and active species in the oxygen plasma to form SiNO as represented by the following chemical formula.

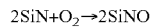

Since SiNO is an unstable substance, nitrogen is separated and sublimated, whereby SiO (silicon monoxide) is formed as shown in the following chemical formula.

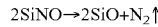

Figure 3B:
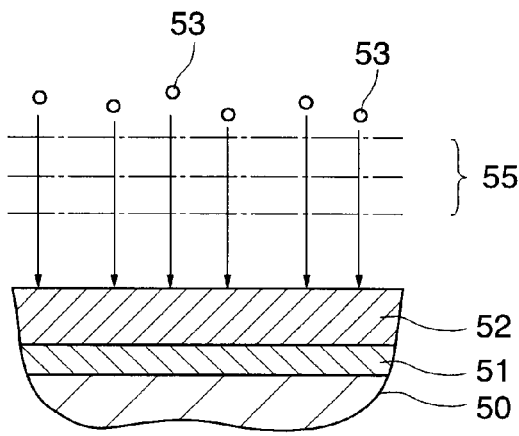
Figure 3C:
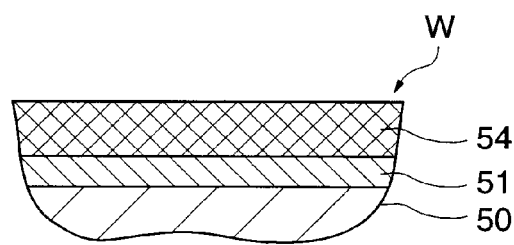

As a result, the silicon nitride film 52 is changed to a silicon monoxide film 54 made of SiO (FIG. 3C). The silicon monoxide film 54, which is changed from the silicon nitride film 52 formed by CVD processing and hence nondense in film structure, is also nondense in film structure. Accordingly, some water molecules are contained in the silicon monoxide film 54. In this embodiment, the silicon monoxide film 54 is selectively etched using hydrofluoric-acid-based selective etching, so as to selectively remove the silicon nitride film 52.

Next, an explanation will be given of a substrate processing method according to this embodiment, which is executed by the substrate processing system 10 shown in FIG. 1.

First, a wafer W is prepared, in which a thermally-oxidized film 51 made of $SiO_2$ is formed on a silicon substrate 50, and then a silicon nitride film 52 made of SiN is formed on the thermally-oxidized film 51 (FIG. 3A). Subsequently, the wafer W is transferred into the chamber of the first process module 25 and placed on the ESC 28.

Next, oxygen gas is introduced into the chamber and an electric field is generated between the upper and lower electrodes, whereby the oxygen gas is converted into plasma, thereby generating active species 53 in the oxygen plasma, so as to cause the active species 53 in the oxygen plasma to be in contact with the silicon nitride film 52 (oxygen-containing plasma contact step). At this time, due to the presence of the electric field, a sheath 55 is generated parallel to a surface of the wafer W in a space near the surface of the wafer W. In the sheath 55, there is generated a potential difference in the direction perpendicular to the surface of the wafer W. When the oxygen plasma passes through the sheath 55, the sheath 55 accelerates the active species 53, for example cations, in the oxygen plasma in the direction perpendicular to the surface of the wafer W. As a result, the active species 53 in the oxygen plasma are perpendicularly in contact with the silicon nitride film 52 formed on the surface of the wafer W (FIG. 3B). As described above, the active species 53 in the oxygen plasma having been made in contact with the silicon nitride film 52 cause the silicon nitride film 52 to be changed to the silicon monoxide film 54 (FIG. 3C).

Next, the wafer W is transferred out from the chamber of the first process module 25 and transferred into the chamber 38 of the second process module 34 via the loader unit 13. Then, the wafer W is placed on the mounting stage 39.

Figure 3D:
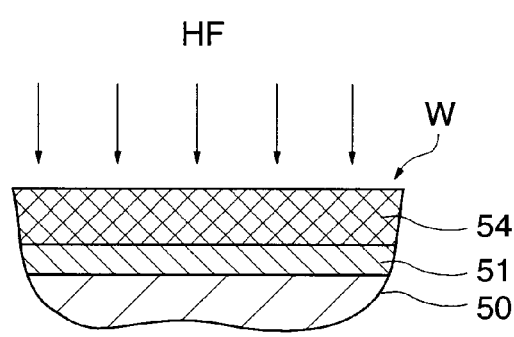

The pressure in the chamber 38 is set to $1.3 \times 10^2$ to $1.1 \times 10^3$ Pa (1 to 8 Torrs), and the ambient temperature in the chamber 38 is set to a value ranging from 40 to 60 Celsius degrees using the heater in the side wall. Then, HF gas is supplied toward the wafer W from the gas supply unit 43 of the shower head 40 at a flow rate ranging from 40 to 60 SCCM (HF gas supply step) (FIG. 3D). It should be noted that water molecules are nearly completely removed from the chamber 38, without $H_2O$ gas being supplied into the chamber 38.

Figure 3E:
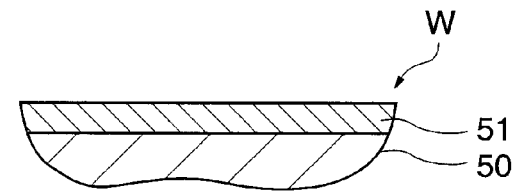

As described above, the silicon monoxide film 54 includes some water molecules. Thus, HF gas reaching the silicon monoxide film 54 is combined with water molecules contained in the silicon monoxide film 54 to thereby form hydrofluoric acid. The resultant hydrofluoric acid removes the silicon monoxide film 54. On the other hand, even if HF gas reaches the thermally-oxidized film 51 which is exposed when the silicon monoxide film 54 has been removed by the hydrofluoric acid, the HF gas is not converted into hydrofluoric acid since the thermally-oxidized film 51 contains substantially no water molecules, and therefore, the thermally-oxidized film 51 is hardly removed. As a result, the silicon monoxide film 54 is selectively etched and removed (FIG. 3E).

Next, the wafer W is transferred out from the chamber 38 of the second process module 34, whereupon the present process is completed.

With the substrate processing method according to this embodiment, active species 53 in oxygen plasma are in contact with the wafer W having the thermally-oxidized film 51 and the silicon nitride film 52, and HF gas is supplied toward the wafer W. The active species 53 in the oxygen plasma change the silicon nitride film 52 to a silicon monoxide film 54, and hydrofluoric acid generated from the HF gas selectively etches the silicon monoxide film 54 changed from the silicon nitride film 52. As a result, it is possible to selectively remove the silicon nitride film 52.

According to the above described substrate processing method, when the HF gas is supplied to the wafer W, almost all of water molecules are removed from the chamber 38, and $H_2O$ gas is not supplied to the chamber 38. Accordingly, in the thermally-oxidized film 51 containing substantially no water molecules, HF gas is hardly combined with water molecules and hence hydrofluoric acid is hardly produced. Accordingly, the oxide film 51 is hardly removed. Thus, the silicon monoxide film 54 can selectively be etched with more reliability.

With the above described substrate processing method, water molecules are substantially completely removed from the chamber 38. $H_2O$ gas is not supplied to the chamber 38, and water molecules contained in the silicon monoxide film 54 of the wafer W are consumed during the reaction between $SiO_2$ and hydrofluoric acid. Thus, it is possible to maintain the interior of the chamber 38 extremely dry. As a consequence, it is possible to suppress particles from being produced and watermarks from being generated on the wafer W due to the presence of water molecules, whereby the reliability of semiconductor devices manufactured using wafers can further be improved.

Next, an explanation will be give of a substrate processing method according to a second embodiment of this invention.

This embodiment is the same or similar in construction and function to the above described first embodiment, but is different therefrom only in the construction of substrates to be subjected to processing. Explanations on similar constructions will be omitted, and the constructions and functions different from those of the first embodiment will mainly be described in the following.

FIG. 4 is a view showing a process of the substrate processing method according to the present embodiment.

Figure 4A:
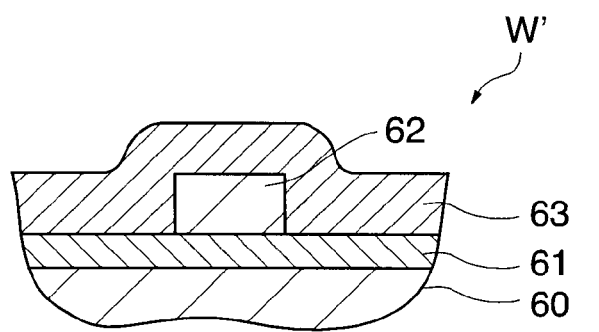

First, a wafer W' is prepared, in which a thermally-oxidized film 61 made of $SiO_2$ is uniformly formed on a silicon substrate 60, a gate electrode 62 (a protruding conductive portion) made of a polysilicon and having a rectangular shape in cross section that protrudes perpendicularly from a surface of the wafer W' is formed on the thermally-oxidized film 61, and a silicon nitride film 63 made of SiN is formed on the thermally-oxidized film 61. In this wafer W', the silicon nitride film 63 not only covers the thermally-oxidized film 61, but also covers side surfaces and a top surface of the gate electrode 62 (FIG. 4A). The wafer W' is then transferred into the chamber of the first process module 25 and placed on the ESC 28.

Next, oxygen gas is introduced into the chamber and an electric field is generated between the upper and lower electrodes, whereby the oxygen gas is converted into plasma to thereby cause active species 53 to be generated in the oxygen plasma, and the active species 53 contained in the oxygen plasma are made in contact with the silicon nitride film 63 (oxygen-containing plasma contact step). At this time, as with the first embodiment, a sheath 55 is generated parallel to a surface of the wafer W' in a space in the vicinity of the surface of the wafer W'.

Figure 4B:
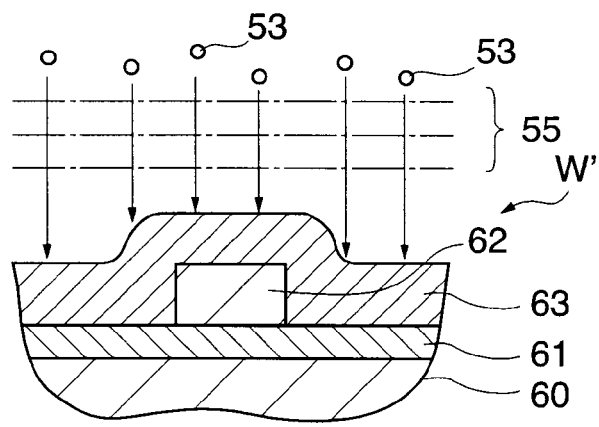

The active species 53 in the oxygen plasma passing through the sheath 55, such as for example cations, are accelerated in the direction perpendicular to the surface of the wafer W' by the sheath 55, and move in the perpendicular direction. The direction perpendicular to the surface of the wafer W' extends parallel to a side surface of the gate electrode 62, and therefore, the active species 53 in the oxygen plasma passing through the sheath 55 move in the direction substantially parallel to the side surface of the gate electrode 62, and are in perpendicular contact with the silicon nitride film 63 (FIG. 4B).

Figure 4C:
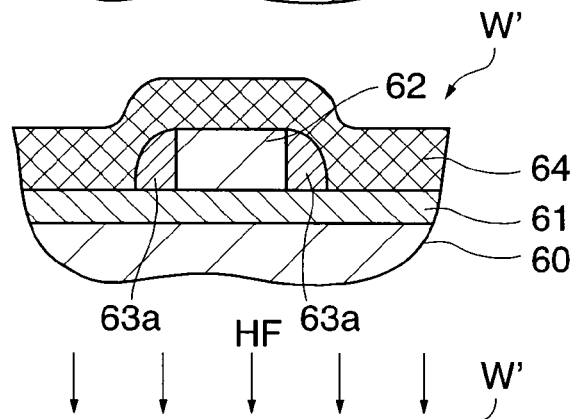

The active species 53 in the oxygen plasma that has been in contact with the silicon nitride film 63 cause the silicon nitride film 63 to be changed to the silicon monoxide film 64 as described above. However, those parts of the silicon nitride film 63 which cover the side surfaces of the gate electrode 62 are large in thickness as viewed in the direction along which the active species 53 move (the direction perpendicular to the surface of the wafer W'). Thus, the active species 53 in the oxygen plasma cannot adequately intrude into the parts of the silicon nitride film 63 covering the side surfaces of the gate electrode 62. As a result, the nitride portions 63a not having been changed to the silicon monoxide film 64 remain on the side surfaces of the gate electrode 62 (FIG. 4C). On the other hand, a flat portion of the silicon nitride film 63 which covers the top surface of the gate electrode 62 and a flat portion thereof that does not cover the gate electrode 62 are changed to the silicon monoxide film 64 by the action of the active species 53 in the oxygen plasma (selective oxidation step).

Next, the wafer W' is transferred out from the chamber of the first process module 25 and transferred into the chamber 38 of the second process module 34 via the loader unit 13. The wafer W' is then placed on the mounting state 39.

Figure 4D:
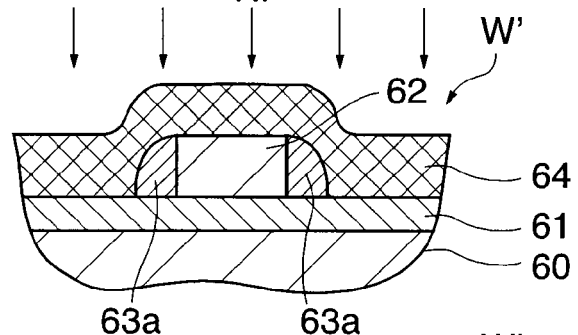

Subsequently, various conditions in the interior of the chamber 38 are set to the same ones as those in the first embodiment. Then, HF gas is supplied toward the wafer W' from the gas supply unit 43 of the shower head 40 at a flow rate ranging from 40 to 60 SCCM (HF gas supply step) (FIG. 4D). It should be noted that, as with the first embodiment, water molecules are nearly completely removed from the chamber 38, without $H_2O$ gas being supplied into the chamber 38.

Figure 4E:
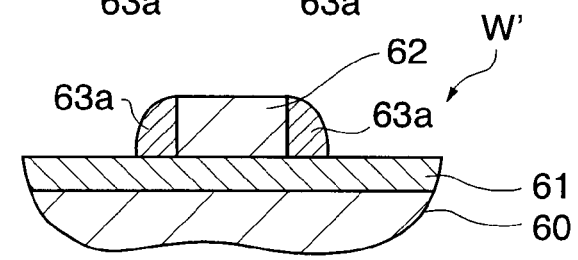

HF gas reaching the silicon monoxide film 64 is combined with water molecules contained in the silicon monoxide film 64 to thereby form hydrofluoric acid. The resultant hydrofluoric acid removes the silicon monoxide film 64. On the other hand, even if HF gas reaches the thermally-oxidized film 61 which is exposed when the silicon monoxide film 64 has been removed by hydrofluoric acid, the HF gas is not converted into hydrofluoric acid since the thermally-oxidized film 61 contains substantially no water molecules. In addition, the nitride portions 63a made of SiN, which are hardly reacted with hydrofluoric acid, cannot be removed even if the nitride portions 63a are exposed. As a result, the silicon monoxide film 64 is selectively etched and removed, and the nitride portions 63a are formed in the side surfaces of the gate electrode 62 (FIG. 4E). In an LDD (light doped drain) structure, the nitride portions 63a function as a spacer that separates the gate electrode 62 from the source/drain.

Next, the wafer W' is transferred out from the chamber 38 of the second process module 34, and then the present process is completed.

According to the substrate processing method of this embodiment, active species 53 in oxygen plasma move toward the silicon nitride film 63 that covers the side surfaces and the top surface of the gate electrode 62 in the direction substantially parallel to the side surfaces of the gate electrode (in the direction perpendicular to the surface of the wafer W'). The active species 53 in the oxygen plasma are brought in contact with the silicon nitride film 63. Since those parts of the silicon nitride film 63 which cover or coat the side surfaces of the gate electrode 62 each have a large thickness as viewed in the direction of the movement of the active species 53. Therefore, the active species 53 contained in the oxygen plasma cannot sufficiently intrude into the parts of the silicon nitride film 63 covering the side surfaces of the gate electrode 62. As a result, the nitride portions 63a that have not been changed to the silicon monoxide film 64 remain on the side surfaces of the gate electrode 62, although a flat portion of the silicon nitride film 63 which covers the top surface of the gate electrode 62 and a flat portion thereof which does not cover the gate electrode 62 are changed to the silicon monoxide film 64 by the action of the active species 53 in the oxygen plasma. Hydrofluoric acid generated from the HF gas selectively etches the silicon monoxide film 64 changed from the silicon nitride film 63, but hardly etches the nitride portions 63a. As a result, parts of the silicon nitride film 63 (specifically, the flat portion of the silicon nitride film 63 which covers the top surface of the gate electrode 62 and the flat portion thereof which does not cover the gate electrode 62) other than the nitride portions 63a thereof which cover the side surfaces of the gate electrode 62 can selectively be removed.

It should be noted that in the above described substrate processing method, it is difficult for hydrofluoric acid to completely remove all the silicon monoxide, and therefore, some silicon monoxide is, of course, contained in the nitride portions 63a or the like.

In the above described embodiments, the silicon nitride film is oxidized using oxygen plasma. This is not limitative. For oxidization of the silicon nitride film, any plasma that contains at least oxygen can be used.

In the above described embodiments, when oxygen plasma is made in contact with the silicon nitride film 52 (silicon nitride film 53) of a wafer W, a bias voltage is not applied to the lower electrode of the first process module 25. However, to make the oxygen plasma to be in reliable contact with the silicon nitride film 52, a bias voltage may be applied to the lower electrode.

Substrates to which the substrate processing methods according to the above described embodiments are applied are not limited to semiconductor device wafers, but may be various substrates for use for an LCD or an FPD (flat panel display) or the like, photomasks, CD substrates, print substrates, and so on.

It is to be understood that the present invention may be attained by supplying to a system or an apparatus a storage medium in which is stored a program code of software that realizes the functions of any of the above described embodiments, and then causing a computer (or CPU, MPU, or the like) of the system or the apparatus to read out and execute the program code stored in the storage medium.

In this case, the program code itself read out from the storage medium realizes the functions of any of the above described embodiments, and hence the program code and the storage medium in which the program code is stored constitute the present invention.

The storage medium for supplying the program code may be, for example, a floppy (registered trademark) disk, a hard disk, a magnetic-optical disk, an optical disk such as a CD-ROM, a CD-R, a CD-RW, a DVD-ROM, a DVD-RAM, a DVD-RW, or a DVD+RW, a magnetic tape, a non-volatile memory card, or a ROM. Alternatively, the program code may be downloaded via a network.

Moreover, it is to be understood that the functions of any of the embodiments described above may be accomplished not only by executing a program code read out by a computer, but also by causing an OS (operating system) or the like that operates on the computer to perform a part or all of the actual operations based on instructions of the program code.

Furthermore, it is to be understood that the functions of any of the embodiments described above may also be accomplished by writing a program code read out from the storage medium into a memory provided on an expansion board inserted into a computer or in an expansion unit connected to the computer, and then causing a CPU or the like provided on the expansion board or in the expansion unit to perform a part or all of the actual operations based on instructions of the program code.

What is claimed is:

1. A substrate processing method for processing a substrate having a thermally-oxidized film formed by thermal oxidation processing and a nitride film in a chamber, comprising:
    an oxygen-containing plasma contact step of causing oxygen-containing plasma to be in contact with the substrate; and
    an HF gas supply step of supplying HF gas toward the substrate with which the oxygen-containing plasma has been in contact,
    wherein the nitride film comprises a silicon nitride film and is changed to a silicon monoxide film in said oxygen-containing plasma contact step, and
    wherein, in said HF gas supply step, water molecules are removed from the chamber in a state in which two types of silicon oxide films, which respectively corresponds to the thermally-oxidized film and the silicon monoxide film and have different densities, exist contemporaneously in such a manner that water molecules remain in a silicon oxide film having less density between the two types of silicon oxide films, and the HF gas is supplied to selectively remove the silicon oxide film having less density.

2. The substrate processing method according to claim 1, wherein the silicon monoxide film is less dense than the thermally-oxidized film.

3. The substrate processing method according to claim 1, wherein the HF gas is supplied at a flow rate ranging from 40 to 60 SCCM.

4. The substrate processing method according to claim 1, wherein in said HF gas supply step, when water molecules are removed from the chamber, the pressure of the chamber is set to $1.3 \times 10^2$ to $1.1 \times 10^3$ Pa (1 to 8 Torr), and the ambient temperature in the chamber is set to a value ranging from 40 to 60 Celsius degrees, so that water molecules remains in the silicon oxide film having less density.

5. The substrate processing method according to claim 1, wherein the substrate comprises a protruding conductive portion on the thermally-oxidized film, the protruding conductive portion perpendicularly protruding from a surface of the substrate,
    wherein the nitride film covers side surfaces and a top surface of the conductive portion, and
    wherein in said oxygen-containing plasma contact step, active species in the oxygen-containing plasma move in a direction approximately perpendicular to the surface of the substrate, whereby the active species are in contact with the nitride film.

6. The substrate processing method according to claim 5, further including:
    a selective oxidation step of selectively oxidizing a flat portion of the nitride film.

7. The substrate processing method according to claim 1, wherein the substrate has a protruding conductive portion thereof protruding from the thermally-oxidized film,
    wherein the nitride film covers side surfaces and a top surface of the conductive portion, and
    wherein in said oxygen-containing plasma contact step, active species in the oxygen-containing plasma move substantially parallel to the side surfaces of the conductive portion and are in contact with the nitride film.

8. The substrate processing method according to claim 7, wherein the active species include at least cations.

9. The substrate processing method according to claim 7, further including:
    a selective oxidation step of selectively oxidizing a flat portion of the nitride film.

* * * * *